(12) United States Patent
Li et al.

(10) Patent No.: US 11,031,573 B2
(45) Date of Patent: Jun. 8, 2021

(54) ENCAPSULATION LAYER OF FLEXIBLE DISPLAY PANEL AND FLEXIBLE DISPLAY

(71) Applicant: Wuhan China Star Optoelectronics Semiconductor Display Technology Co., Ltd., Hubei (CN)

(72) Inventors: Shuang Li, Guangdong (CN); Peng Li, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/961,519

(22) Filed: Apr. 24, 2018

(65) Prior Publication Data
US 2019/0165308 A1    May 30, 2019

Related U.S. Application Data

(63) Continuation of application No. PCT/CN2018/074834, filed on Jan. 31, 2018.

(30) Foreign Application Priority Data

Nov. 30, 2017   (CN) .......................... 201711247586.1

(51) Int. Cl.
  *H01L 51/52*   (2006.01)
  *H01L 51/00*   (2006.01)
  *H01L 27/32*   (2006.01)
(52) U.S. Cl.
  CPC ...... *H01L 51/5246* (2013.01); *H01L 27/3223* (2013.01); *H01L 51/0097* (2013.01);
(Continued)

(58) Field of Classification Search
  CPC . H01L 51/0097; H01L 27/12; H01L 27/1218; H01L 27/3223
  See application file for complete search history.

(56) References Cited

U.S. PATENT DOCUMENTS

2017/0062760 A1* 3/2017 Kim ................... H01L 51/5253
2017/0162821 A1* 6/2017 Oh ...................... H01L 51/5256
(Continued)

FOREIGN PATENT DOCUMENTS

CN      205450505 U    8/2016
CN      206210301 U    5/2017
(Continued)

OTHER PUBLICATIONS

Machine translation of CN 106848107A, published Jun. 13, 2017.*
Office Action dated Mar. 11, 2019 from corresponding application No. CN 201711247586.1.

*Primary Examiner* — Suberr L Chi
(74) *Attorney, Agent, or Firm* — Hemisphere Law, PLLC; Zhigang Ma

(57) ABSTRACT

The disclosure provides a flexible display panel and a flexible display, by disposing a plurality of notches at intervals on an edge of the encapsulation layer of the flexible display panel near the bending area of the flexible display panel, so that when the flexible display panel is bent in the bending area, the bending stress applied to the edge of the encapsulation layer can be dispersed through the notches, so as to avoid the problem that warping of the edge of the encapsulation layer may be caused by the bending stress, thereby increasing the reliability of the flexible display panel.

12 Claims, 3 Drawing Sheets

(52) U.S. Cl.
CPC ...... *H01L 51/5256* (2013.01); *H01L 27/3244* (2013.01); *H01L 2251/5338* (2013.01)

(56) References Cited

U.S. PATENT DOCUMENTS

| | | | |
|---|---|---|---|
| 2017/0229665 A1* | 8/2017 | Park | H01L 51/0097 |
| 2017/0371376 A1* | 12/2017 | Chung | H05K 1/028 |
| 2018/0114943 A1* | 4/2018 | Lee | H01L 27/3255 |

FOREIGN PATENT DOCUMENTS

| | | |
|---|---|---|
| CN | 106848107 A | 6/2017 |
| CN | 106935720 A | 7/2017 |
| CN | 107230680 A | 10/2017 |
| CN | 107331795 A | 11/2017 |
| JP | 2011165497 A | 8/2011 |

* cited by examiner

ENCAPSULATION LAYER OF FLEXIBLE DISPLAY PANEL AND FLEXIBLE DISPLAY

RELATED APPLICATIONS

This application is a continuation application of PCT Patent Application No. PCT/CN2018/074834, filed Jan. 31, 2018, which claims the priority benefit of Chinese Patent Application No. 201711247586.1, filed Nov. 30, 2017, which is herein incorporated by reference in its entirety.

FIELD OF THE DISCLOSURE

The disclosure relates to the field of flexible display technology, and in particular to a flexible display panel and a flexible display.

BACKGROUND

Generally, the display area of a flexible display panel is usually encapsulated by a thin film encapsulation (TFE) layer, thereby preventing the display device from being intruded by water and oxygen. Generally, the encapsulation layer needs to completely cover the display area and exceed the display area boundary for better protecting the functions of the display device. And the encapsulation layer generally includes an inorganic film layer to achieve a better effect of preventing water and oxygen from intruding. A bending area is usually arranged at a side of the display area so as to bend the flexible display panel. When the flexible display panel is bent at the bending area, the edge of the encapsulation layer near the bending area may also receive a certain bending stress. Since the inorganic film layer is generally harder, the edge of the encapsulation layer is prone to the risk of warpage. If the encapsulation layer appears warping, it provides a convenient path for water and oxygen intrusion and reduces the reliability of the flexible display panel.

SUMMARY

The disclosure provides a flexible display panel and a flexible display, which can reduce the warping phenomenon of the encapsulation layer of the flexible display panel and increase the reliability of the flexible display panel.

The flexible display panel includes a display area and a bending area located at a side of the display area, the display area is covered with an encapsulation layer, and an edge of the encapsulation layer near the bending area is located between the bending area and the display area; and a plurality of notches are disposed on the edge of the encapsulation layer near the bending area.

The encapsulation layer includes a plurality of inorganic layers and organic layers alternately arranged in layers, and a material of the organic layer is organic flexible.

The notches are filled with a flexible material to form a flexible material layer.

A material of the flexible material layer is polyimide resin or polyethylene terephthalate plastic.

A protrusion is formed between each two of the notches adjacent to each other; a thickness of the protrusion is gradually reduced in a direction from the display area to the bending area.

A surface of the protrusion away from the flexible substrate is a smooth plane surface or a smooth arc surface.

The notches of the flexible display panel have a shape of an arc, a square, a trapezoid, or a triangle.

An area of the encapsulation layer is larger than an area of the display area, and a boundary of the encapsulation layer is beyond a boundary of the display area.

The display area is disposed with a plurality of thin film transistors arranged in an array and a plurality of organic light emitting devices in one-to-one correspondence and electrically connected to the thin film transistors arranged in an array.

The flexible display includes the flexible display panel.

In the flexible display panel provided by the disclosure, by disposing a plurality of the notches at intervals on the edge of the encapsulation layer near the bending area, when the flexible display panel is bent in the bending area, the bending stress applied to the edge of the encapsulation layer can be dispersed through the notches, so as to avoid the problem that warping of the edge of the encapsulation layer may be caused by the bending stress, thereby increasing the reliability of the flexible display panel.

BRIEF DESCRIPTION OF THE DRAWINGS

In order to illustrate technical proposal of the disclosure or the prior art more clearly, the following section briefly introduces drawings used to describe the embodiments and prior art. Obviously, the drawing in the following descriptions is just some embodiments of the disclosure. The ordinary person in the related art can acquire the other drawings according to these drawings without offering creative effort.

DETAILED DESCRIPTION OF PREFERRED EMBODIMENTS

The following sections offer a clear, complete description of this disclosure in combination with the embodiments and accompanying drawings. Obviously, the embodiments described herein are only a part of, but not all of the embodiments of this disclosure. In view of the embodiments described herein, any other embodiment obtained by those of ordinary skilled in this art without offering creative effort is included in a scope claimed by this disclosure.

Figure 1:
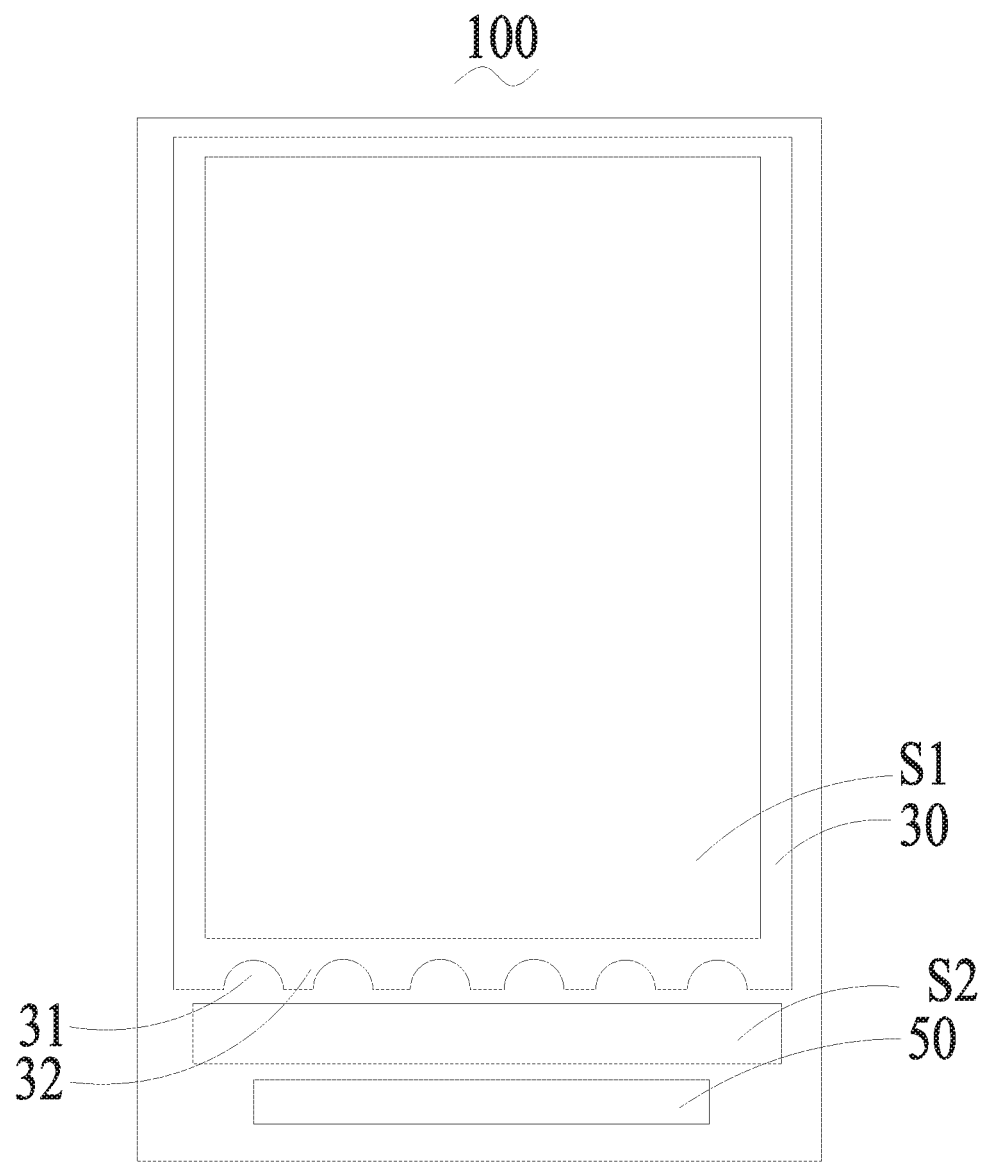
FIG. 1 is a schematic structural view of a flexible display panel according to an embodiment of the disclosure.
Figure 2:
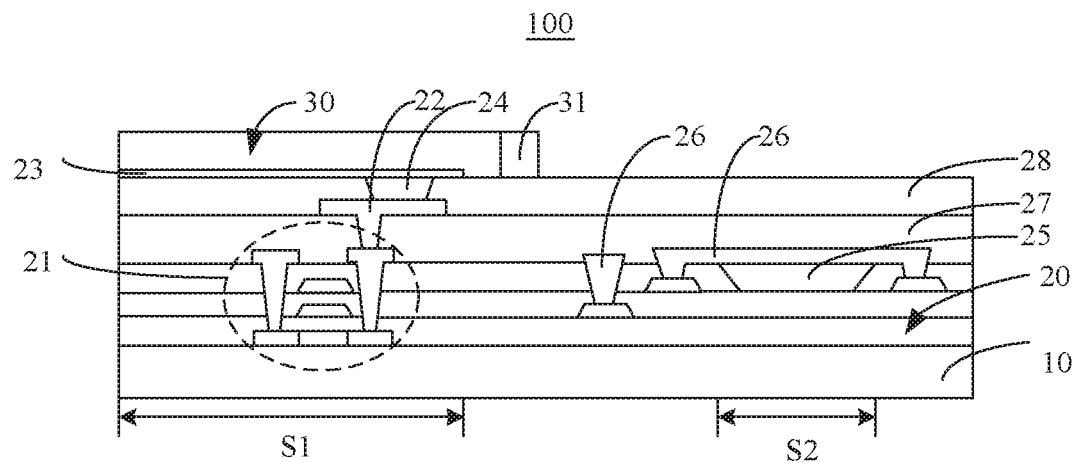
FIG. 2 is a schematic cross-sectional view of the flexible display panel of the embodiment described in FIG. 1.

Referring to FIG. 1 and FIG. 2, the disclosure provides a flexible display panel 100. The flexible display panel 100 includes a flexible substrate 10 and a device layer 20 stacked on the flexible substrate 10. In this embodiment, the flexible substrate 10 is made of polyimide (PI) material. The flexible display panel 100 includes a display area S1 and a non-display area surrounding the display area S1. The non-display area is disposed with a bending area S2, and the bending area S2 is disposed at a side of the display S1. The display area S1 is configured to display a picture, and the non-display area is configured to arrange the wiring of the flexible display panel 100 and the like. The flexible display panel 100 is bent in the bending area S2. The device layer 20 is disposed with an encapsulation layer 30. The encapsulation layer 30 covers the display area S1 and is spaced apart from the bending area S2. The encapsulation layer 30 prevents water and oxygen from entering the display area S1, so as to ensure the display effect of the organic light-emitting device in the display area S1. At the same time, by spacing the encapsulation layer 30 from the bending area S2, the flexible display panel 100 can be easily bent at a position of the bending area S2 to ensure that the flexible display panel 100 has a better bending performance.

A device layer 20 is disposed on the flexible substrate 10, and the flexible display panel 100 performing screen display is achieved by a portion of the display area S1 of the device layer 20. In this embodiment, the flexible display panel is an AMOLED display panel. The display area S1 of the device layer 20 includes a plurality of thin film transistors arranged in an array, a plurality of organic light emitting devices in one-to-one correspondence and electrically connected to the thin film transistors 21 arranged in an array, and a plurality of signal lines 26 electrically connected to each of the thin film transistors 21. Further, since the non-display area is not configured to display a picture, the non-display area does not include the thin film transistor 21 and the organic light emitting device. The organic light emitting device includes a first electrode 22, a second electrode 23 opposite to each other, and an organic light-emitting layer 24 disposed between the first electrode 22 and the second electrode 23. The first electrode 22 is electrically connected to the thin film transistor 21, by controlling the switching of the thin film transistors 21 to control the emitting of the organic light emitting devices corresponding to the thin film transistors 21; the different screen displays are performed. Specifically, in this embodiment, the device layer 20 further includes a first organic photoresist layer 27 and a second organic photoresist layer 28 sequentially stacked on the thin film transistor 21. Specifically, the first organic photoresist layer 27 is stacked on the thin film transistor 21. The first electrode 22 is stacked on the first organic photoresist layer 27 and is electrically connected to the thin film transistor 21 through a via hole. The second organic photoresist layer 28 is stacked on the first electrode 22. An opening hole is formed in the second organic photoresist layer 28. The organic light-emitting layer 24 is deposited in the opening hole and is connected to the first electrode 22. The second electrode 23 is stacked on the second organic photoresist layer 28 and is connected to the organic light emitting layer 24. It is understandable that the flexible display panel also has other types of display panels, such as a PMOLED display panel.

A position of the device layer 20 located at the bending area S2 includes a flexible material layer 25. The flexible material layer 25 is located on the same layer as the thin film transistor 21, and the first organic photoresist layer 27 and the second organic photoresist layer 28 are stacked on the flexible material layer 25. The flexible material layer 25 is a polymer organic material with a high modulus of elasticity, such as polyethylene terephthalate (PET) and polyimide (PI) material. By disposing the flexible material layer 25 in the bending area 25, the bending area S2 has better bending properties than the display area S1. Therefore, the flexible display panel 100 can achieve better bending in the bending area S2.

The signal lines 26 electrically connected to the thin film transistors 21 are fanned out from the display area S1 and are electrically connected to a driving chip 50. The signal lines 26 and the thin film transistors 21 are located in the same layer and are simultaneously formed with the thin film transistors 21. In this embodiment, the driving chip 50 is located on a side of the bending area S2 away from the display area S1. The signal lines 26 are electrically connected to the driving chip 50 across the bending area S2. The driving signal of the driving chip 50 is transmitted to the position of the thin film transistor in the display area through the signal lines 26 so as to control the flexible display panel 100 to perform different screen display. It can be understood that, in other embodiments of the disclosure, the driving chip 50 may not be disposed on the flexible display panel 100 and may be disposed on a flexible circuit board by the COF (chip-on-film) process.

Figure 5:
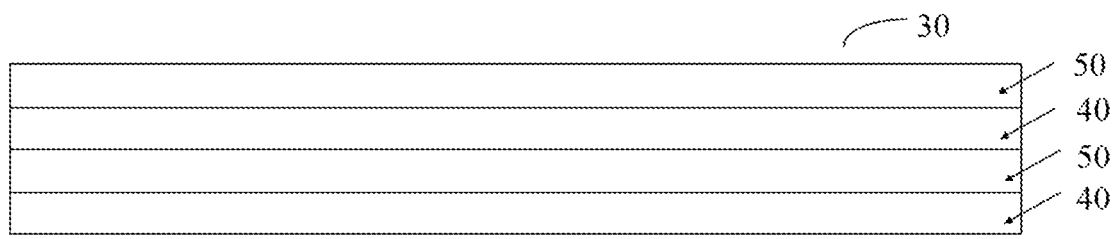
FIG. 5 is a schematic cross-sectional view of the encapsulation layer according to an embodiment of the disclosure.

The encapsulation layer 30 is stacked on the device layer 20, and the encapsulation layer 30 covers the display area S1. The encapsulation layer 30 prevents water and oxygen from entering the display area S1, so as to ensure the display effect of the organic light-emitting devices in the display area S1. An edge of the encapsulation layer 30 near the display area S1 is located between the bending area S2 and the display area S1. In other words, an area of the encapsulation layer 30 is larger than an area of the display area S1, when the encapsulation layer 30 covers the display area S1, a boundary of the encapsulation layer 30 is beyond a boundary on the display area S1, so that when the encapsulation layer 30 is stacked on the device layer 20 and covers the display area S1, the boundary of the encapsulation layer 30 slightly exceeds the display area S1, so as to achieve better prevention of the display area S1 from being intruded by water and oxygen. In the disclosure, as shown in FIG. 5, the encapsulation layer 30 includes a plurality of inorganic layers 40 and organic layers 50 alternately arranged in layers. The number of layers of the organic layers 50 and the inorganic layers 40 can be changed as needed. The inorganic layers 40 are formed by vapor deposition of an inorganic material such as SiOx and SiNx, having low water permeability to oxygen and well preventing the risk of water and oxygen intrusion. The organic layer 50 may be formed by vapor deposition, spin coating or the like and may be formed by a polymer material having a relatively high elastic modulus, such as PI or PET, having a better bending property so as to ensure that the organic layer have a better effect of preventing the water and oxygen intrusion, the flexible display panel 100 having a better bending effect is achieved, thereby obtaining a better curved display effect. The edge of the encapsulation layer 30 is spaced apart from the bending area S2, that is, there is a gap between the edge of the encapsulation layer 30 and the bending area S2, so as to prevent the encapsulation layer 30 from extending to the bending area S2, thereby affecting the bending performance of the bending area S2.

A plurality of notches 31 are formed by patterning and disposed at intervals on an edge of the encapsulation layer 30 near the bending area S2. A protrusion 32 is formed between each two of the notches 31 adjacent to each other, that is, the edge of the encapsulation layer 30 near the bending area S2 is a curve having a concave-convex structure. There is a gap between the notches 31 and the display area S1, that is, there is a certain distance between the position of the notches 31 closest to the display area S1 and the edge of the display area S1 near the notches 31, and the notches 31 do not extend into the display area S1, thereby preventing external water and oxygen from entering the display area S1 through the notches 31. By disposing a plurality of the notches 31 at intervals on the edge of the encapsulation layer 30 near the bending area S2, when the flexible display panel 100 is bent in the bending area S2, the bending stress applied to the edge of the encapsulation layer 30 can be dispersed through the notches 31, so as to avoid the problem that warping of the edge of the encapsulation layer 30 may be caused by the bending stress, thereby increasing the reliability of the flexible display panel 100. In the disclosure, the notches 31 may be any shape. For example, the notches 31 may have a shape of an arc, a square, a trapezoid, or a triangle. In this embodiment, the notches 31 may be arc-shaped. There is no corner on the arc-shaped notches 31 so that stress does not generate stress concentration at the corner, thereby avoiding possible cracking of the encapsulation layer 30 and other issues.

Figure 3:
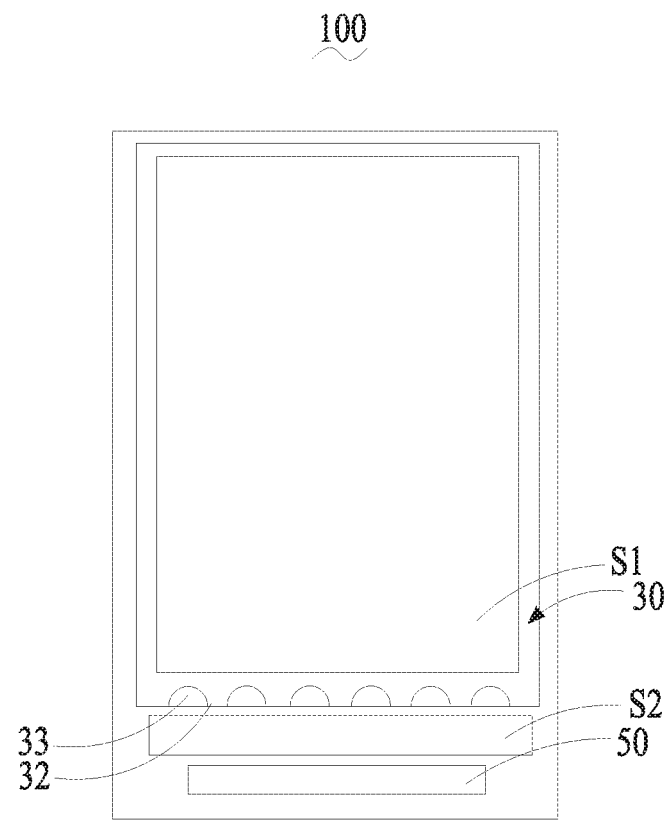
FIG. 3 is a schematic structural view of the flexible display panel according to another embodiment of the disclosure.

Referring to FIG. 3, in another embodiment of the disclosure, a flexible material layer 33 is deposited in the notches 31. The flexible material layer 33 is a polymer organic material with a high modulus of elasticity, such as PET and PI material. In this embodiment, the material of the flexible material layer 33 is the same as the material of the organic layer of the encapsulation layer 30, so that when the flexible material layer 33 is deposited in the notches 31, the flexible material layer 33 can be combined with the encapsulation layer 30 more closely. Further, by disposing the flexible material layer 33 in the notches 31, the reinforcing of the bending performance of the edge of the encapsulation layer 30 can be achieved while dispersing the bending stress on the edge of the encapsulation layer 30 and preventing warping of the edge of the encapsulation layer 30, thereby further avoiding the problem of warping of the edge of the encapsulation layer 30 caused by the bending stress and preventing the problem of cracking that may occur during the bending of the protrusions 32.

Figure 4:
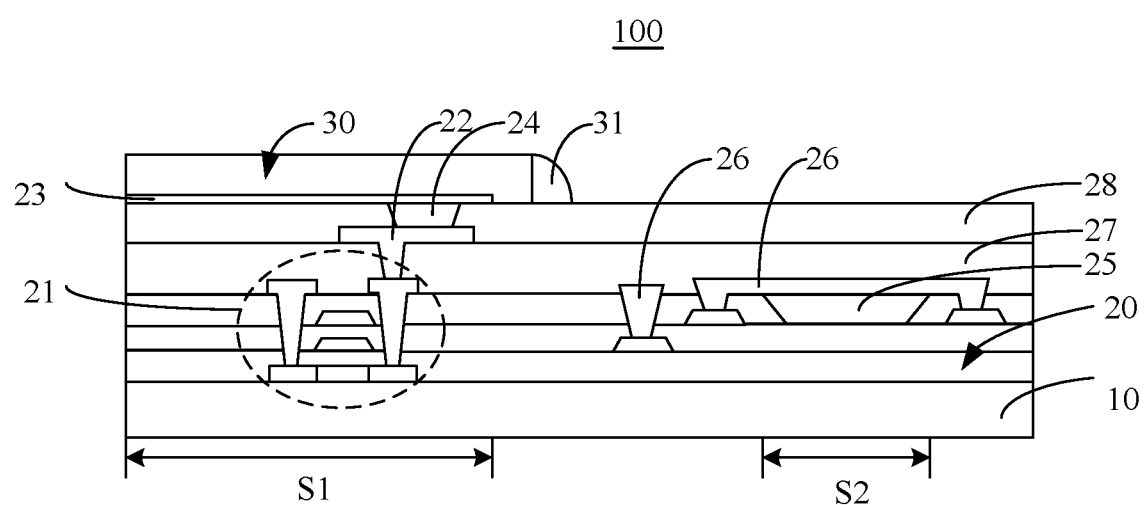
FIG. 4 is a schematic cross-sectional view of the flexible display panel according to another embodiment of the disclosure.

Further, referring to FIG. 4, another embodiment of the disclosure differs from the embodiment shown in FIG. 3 in that the thickness of the protrusions 32 is gradually reduced in the direction from the display area S1 to the bending area S2, that is, the surface 321 of the protrusions 32 away from the flexible substrate 10 forms an included angle with a plane of the flexible substrate 10, thereby further enhancing the bending performance of the encapsulation layer 30 adjacent to the bending area S2, thereby further avoiding the warping of the edge of the encapsulation layer 30 near the bending area S2. In this embodiment, the surface 321 is a smooth plane surface, that is, there is no corner on the surface 321, so as to ensure that when the edge of the encapsulation layer 30 near the bending area S2 is bent, the stress will not be concentrated at the corner, and therefore, the problem that a crack occurs in the edge of the encapsulation layer 30 near the bending area S2 will not occur. The surface 321 may be a smooth plane or a smooth arc surface.

In the flexible display panel 100 provided by the disclosure, by disposing a plurality of the notches 31 at intervals on an edge of the encapsulation layer 30 near the bending area S2, when the flexible display panel 100 is bent in the bending area S2, the bending stress applied to the edge of the encapsulation layer 30 can be dispersed through the notches 31, so as to avoid the problem that warping of the edge of the encapsulation layer 30 may be caused by the bending stress, thereby increasing the reliability of the flexible display panel 100.

The disclosure further provides a flexible display, which may be various flexible display products such as a flexible mobile phone, an electronic newspaper, and a flexible display screen. The flexible display includes the flexible display panel 100 so as to ensure that the flexible display has a good quality.

The above is only the preferred embodiments of the disclosure, and certainly cannot be used to limit the scope of the disclosure. Those skilled in the art may understand that all or part of the processes of the above embodiments may be implemented and that the claims of the disclosure equivalent changes are still within the scope of the disclosure.

What is claimed is:

1. A flexible display panel, comprising:
   a display area; and
   a bending area located at a side of the display area;
   wherein the display area is covered with an encapsulation layer, an edge of the encapsulation layer near the bending area between the bending area and the display area;
   wherein a plurality of notches are disposed at intervals on the edge of the encapsulation layer near the bending area between the bending area and the display area;
   wherein a protrusion is formed between two of the plurality of notches adjacent to each other, and a thickness of the protrusion is gradually reduced in a direction from the display area to the bending area, a terminal of the protrusion is located between the bending area and the display area;
   wherein the encapsulation layer comprises a plurality of inorganic layers and organic layers alternately arranged, and a material of the organic layers is organic flexible material; and
   wherein the plurality of notches are filled with the organic flexible material, so as to form a flexible material layer.

2. The flexible display panel according to claim 1, wherein a material of the organic flexible material layer is polyimide resin or polyethylene terephthalate plastic.

3. The flexible display panel according to claim 1, wherein a surface of the protrusion away from a flexible substrate is a smooth plane surface or a smooth arc surface.

4. The flexible display panel according to claim 1, wherein the plurality of notches of the flexible display panel have a shape of an arc, a square, a trapezoid, or a triangle.

5. The flexible display panel according to claim 1, wherein an area of the encapsulation layer is larger than an area of the display area, and a boundary of the encapsulation layer is beyond a boundary of the display area.

6. The flexible display panel according to claim 1, wherein the display area is disposed with a plurality of thin film transistors arranged in an array and a plurality of organic light emitting devices in one-to-one correspondence and electrically connected to the thin film transistors arranged in an array.

7. A flexible display, comprising:
   a flexible display panel;
   wherein the flexible display panel comprises a display area and a bending area located at a side of the display area, the display area is covered with an encapsulation layer, an edge of the encapsulation layer near the bending area is located between the bending area and the display area, and a plurality of notches are arranged on the edge of the encapsulation layer near the bending area between the bending area and the display area;
   wherein a protrusion is formed between two of the plurality of notches adjacent to each other, and a thickness of the protrusion is gradually reduced in a direction from the display area to the bending area, a terminal of the protrusion is located between the bending area and the display area;
   wherein the encapsulation layer comprises a plurality of inorganic layers and organic layers alternately arranged, and a material of the organic layers is organic flexible material; and
   wherein the plurality of notches are filled with the organic flexible material, so as to form a flexible material layer.

8. The flexible display according to claim 7, wherein a material of the organic flexible material layer is polyimide resin or polyethylene terephthalate plastic.

9. The flexible display according to claim 7, wherein a surface of the protrusion away from a flexible substrate is a smooth plane surface or a smooth arc surface.

10. The flexible display according to claim 7, wherein the plurality of notches of the flexible display panel have a shape of an arc, a square, a trapezoid, or a triangle.

11. The flexible display according to claim 7, wherein an area of the encapsulation layer is larger than an area of the display area, and a boundary of the encapsulation layer is beyond a boundary of the display area.

12. The flexible display according to claim 7, wherein the display area is disposed with a plurality of thin film transistors arranged in an array and a plurality of organic light emitting devices in one-to-one correspondence and electrically connected to the thin film transistors arranged in an array.

\* \* \* \* \*